United States Patent
Burroughes et al.

(10) Patent No.: US 7,494,720 B2
(45) Date of Patent: Feb. 24, 2009

(54) 9-ARYL AND BISARYL SUBSTITUTED POLYFLUORENES

(75) Inventors: Jeremy Burroughes, Cambridgeshire (GB); Richard Friend, Cambridgeshire (GB); Clare Foden, Cambridgeshire (GB)

(73) Assignee: Cambridge Display Technology Limited, Cambridgeshire (GB)

( * ) Notice: Subject to any disclaimer, the term of this patent is extended or adjusted under 35 U.S.C. 154(b) by 0 days.

(21) Appl. No.: 10/533,989

(22) PCT Filed: Nov. 4, 2003

(86) PCT No.: PCT/GB03/04753

§ 371 (c)(1),
(2), (4) Date: Feb. 13, 2006

(87) PCT Pub. No.: WO2004/041902

PCT Pub. Date: May 21, 2004

(65) Prior Publication Data

US 2006/0228576 A1    Oct. 12, 2006

(30) Foreign Application Priority Data

Nov. 6, 2002    (GB)    ................ 0225869.7

(51) Int. Cl.
*H01L 51/54* (2006.01)
*C08G 61/00* (2006.01)
*C09K 11/06* (2006.01)
*H05B 33/14* (2006.01)

(52) U.S. Cl. ........................ 428/690; 428/917; 313/504; 313/506; 257/40; 257/E51.032; 528/394; 528/397; 528/401; 528/422; 528/423

(58) Field of Classification Search ................ 428/690, 428/917; 313/504, 506; 528/362, 330, 394, 528/397, 401, 422, 423; 257/40, E51.032
See application file for complete search history.

(56) References Cited

U.S. PATENT DOCUMENTS

| 5,523,555 | A | 6/1996 | Friend et al. | 250/214 R |
|---|---|---|---|---|
| 5,807,974 | A | 9/1998 | Kim et al. | 528/366 |
| 6,353,083 | B1 | 3/2002 | Inbasekaran et al. | 528/295 |
| 6,790,538 | B2 * | 9/2004 | Naito | 428/690 |
| 6,835,468 | B2 * | 12/2004 | Cho et al. | 428/690 |
| 2003/0044641 | A1 * | 3/2003 | Lee et al. | 428/690 |

FOREIGN PATENT DOCUMENTS

| JP | 10-95972 | 4/1998 |
|---|---|---|
| WO | WO 90/13148 | 11/1990 |
| WO | WO 94/29883 | 12/1994 |
| WO | WO 96/16449 | 5/1996 |
| WO | WO 99/20675 | 4/1999 |
| WO | WO 99/48160 | 9/1999 |
| WO | WO 99/54385 | 10/1999 |
| WO | WO 00/22026 | 4/2000 |
| WO | WO 00/46321 | 8/2000 |
| WO | WO 00/53656 | 9/2000 |
| WO | WO 00/55927 | 9/2000 |
| WO | WO 01/62822 | 8/2001 |

OTHER PUBLICATIONS

"Electrically Conducting and Thermally Stable π-Conjugated Poly(Arylene)s Prepared by Organometallic Processes", Yamamoto, Prog. Polym. Sci. vol. 17, 1992, pp. 1153-1205.
"A Novel RGB Multicolor Light-Emitting Polymer Display", Kobayashi et al., Synthethc Metals 111-112, 2000, pp. 125-128.
International Search Report in PCT/GB2003/004753 dated Jun. 24, 2004.

* cited by examiner

*Primary Examiner*—D. Lawrence Tarazano
*Assistant Examiner*—Camie S Thompson
(74) *Attorney, Agent, or Firm*—Marshall, Gerstein & Borun LLP

(57) ABSTRACT

A polymer formed from optionally substituted first repeat units of formula (I) wherein Ar is selected from (a) aromatic hydrocarbon substituted with at least one electron withdrawing group or electron withdrawing heteroaryl. The polymers have application in electroluminescent devices.

17 Claims, No Drawings

9-ARYL AND BISARYL SUBSTITUTED POLYFLUORENES

This is the U.S. national phase of International Application No. PCT/GB2003/004753 filed Nov. 4, 2003, the entire disclosure of which is incorporated herein by reference.

FIELD OF THE INVENTION

This invention relates to semiconductive polymers, their synthesis and use in optical devices.

BACKGROUND OF THE INVENTION

Electroactive polymers are now frequently used in a number of optical devices such as in polymeric light emitting diodes ("PLEDs") as disclosed In WO 90/13148, photovoltalc devices as disclosed In WO 96/16449 and photodetectors as disclosed in U.S. Pat. No. 5,523,555.

A typical PLED comprises an organic electroluminescent layer located between an anode and a cathode. In operation, holes are injected Into the device through the anode and electrons are injected into the device through the cathode. Holes enter the highest occupied molecular orbital ("HOMO") of the electroluminescent polymer and electrons enter the lowest unoccupied molecular orbital ("LUMO") and then combine to form an exciton which undergoes radiative decay to give light. The color of light emitted from the electroluminescent polymer depends on its HOMO-LUMO bandgap.

An electron transport material is commonly used to assist in transport of electrons from the cathode to the LUMO of the electroluminescent polymer and thus increase device efficiency. Suitable electron transport materials are those having a LUMO level falling between the LUMO level of the electroluminescent polymer and the workfunction of the cathode. Similarly, a hole transporting material having a HOMO level falling between the workfunction of the anode and the HOMO level of the emissive material is commonly used. For example, WO 99/48160 discloses a blend of a hole transporting polymer, an electron transporting polymer and an electroluminescent polymer. Alternatively, the electron transporting functionality and the emissive functionality may be provided by different blocks of a block copolymer as disclosed in WO 00/55927.

A focus In the field of PLEDs has been the development of full color displays for which red, green and blue electroluminescent polymers are required—see for example Synthetic Metals 111-112 (2000), 125-128. To this end, a large body of work has been reported in the development of electroluminescent polymers for each of these three colors with red, green and blue emission as defined by PAL standard 1931 CIE coordinates.

A difficulty encountered with blue electroluminescent polymers is that their lifetime (i.e. the time taken for brightness to halve from a given starting brightness at fixed current) tends to be shorter than that of corresponding red or green materials. One of the factors that has been proposed as contributing to the more rapid degradation of blue materials is that their LUMO levels, and consequently the energy level of the charged state following injection of an electron into the LUMO, tends to be less deep than those of corresponding red or green materials. It is therefore possible that materials comprising these lower electron affinities are less electrochemically stable and therefore more prone to degradation.

For simplicity, a full color display will preferably have the same cathode material for all three electroluminescent materials. This results in the further problem that the energy gap between the LUMO and the workfunction of the cathode for a typical blue electroluminescent polymer is greater than that for a typical red or green electroluminescent polymer. This may contribute to lower efficiency.

Clearly, assisted electron injection into blue electroluminescent polymers is desirable, however the choice of electron transporting material is constrained by the fact that the emissive material is generally that with the smallest bandgap. This limitation is particularly restrictive in the case of blue electroluminescent polymers since the bandgap required for blue emission is the largest of red, green and blue.

Chains of fluorene repeat units, such as homopolymers or block copolymers comprising dialkylfluorene repeat units, may be used as electron transporting materials. In addition to their electron transporting properties, polyfluorenes have the advantages of being soluble in conventional organic solvents and have good film forming properties. Furthermore, fluorene monomers are amenable to Yamamoto polymerization or Suzuki polymerization which enables a high degree of control over the regioregularity of the resultant polymer.

One example of a polyfluorene based polymer Is a blue electroluminescent polymer of formula (a) disclosed in WO 00/55927:

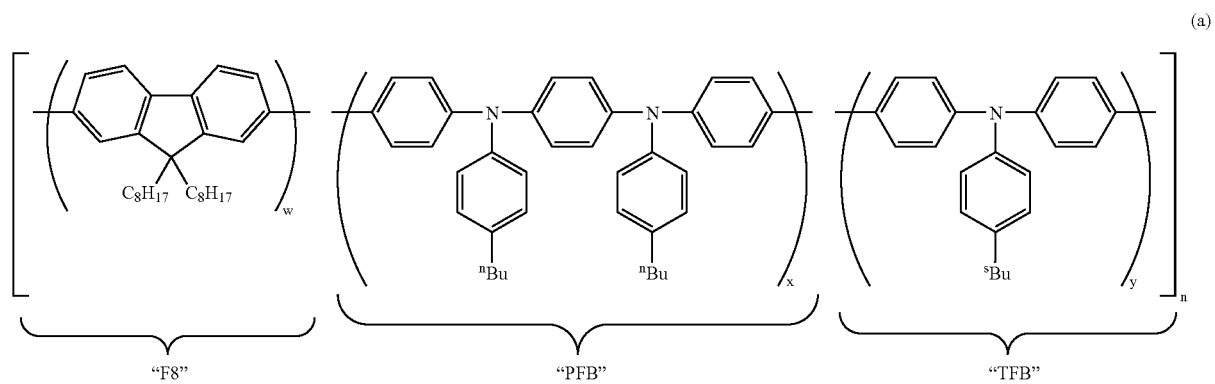

(a)

wherein $w+x+y=1$, $w \geqq 0.5$, $0 \leqq x+y \leqq 0.5$ and $n \geqq 2$.

In this polymer, chains of dioctylfluorene, denoted as F8, function as the electron transport material; the triphenylamine denoted as TFB functions as the hole transport material and the bis(diphenylamino)benzene derivative denoted as PFB functions as the emissive material.

WO 94/29883 discloses use of electron withdrawing groups, particularly nitrile groups, as substituents on electroluminescent polymers for the purpose of reducing the barrier to electron injection between a high workfunction electrode and the electroluminescent polymer. This document only teaches use of such substituents on poly(arylene vinylenes).

J. Poly. Sci. Part A: Polym. Chem. Vol. 39 (2001) discloses a polymer of repeat units of formula (b):

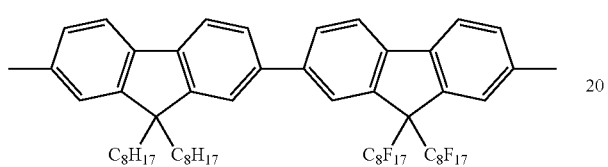

(b)

This disclosure describes use of fluorinated sidechains as a means of decreasing interchain interactions that have been reported to cause aggregation of polyfluorenes and contains no discussion of using such electron deficient substituents as a means to increase electron affinity. This polymer is disclosed as showing no photoluminescence.

There are disclosures of diphenylfluorenes wherein the phenyl group carries substituents, however these substituents are electron donating as measured by their Hammett sigma constants. For example, WO 00/22026 discloses a homopolymer having a repeat unit of formula (c):

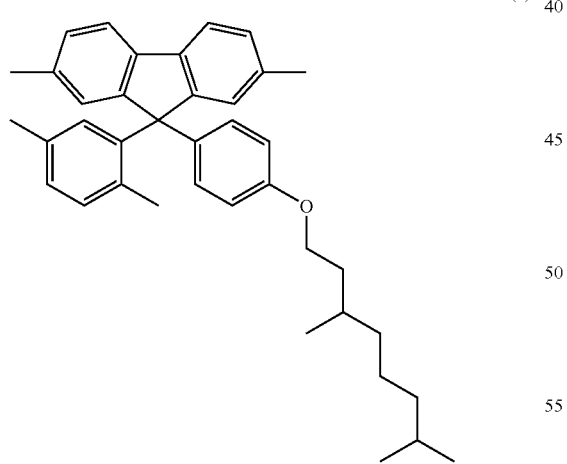

(c)

Also disclosed in this document are copolymers of (c) with dialkylfluorene repeat units and with triarylamine repeat units. Asymmetric substitution of the 9-position of fluorene is described for the purpose of avoiding polymer aggregation; this document contains no teaching of 9-substituents used for the purpose of enhanced electron injection of the fluorene backbone. Similarly, WO 99/20675 discloses a 1:1 copolymer of 9,9-di-n-octylfluorene and 9,9-di(4-methoxyphenyl)

fluorene and WO 01/62822 discloses a polyfluorene with triarylamine 9-substituents.

JP 10095972 discloses a molecule of formula (e):

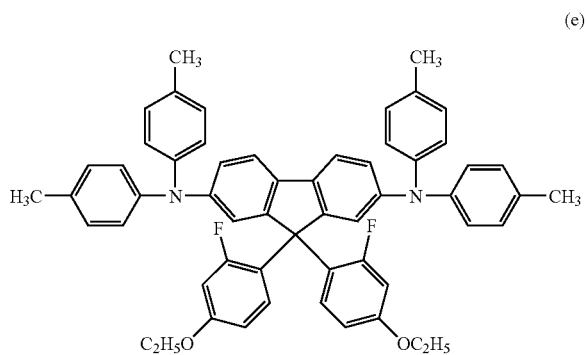

(e)

This is disclosed as an emissive material of the type known as "small molecules" rather than polymers as described hereinbefore. This molecule is used In conjunction with a separate, electron transporting molecule. The use of fluorine substituents on the phenyl ring is not described for the purpose of increasing electron affinity of the fluorene ring; fluorine substituents are merely one of a large number of possible substituents for the phenyl ring disclosed in this document.

It is an object of the invention to provide a high electron affinity material that is capable of functioning as an electron transport material for a blue electroluminescent material. For the reasons explained above, such a material would also be capable of functioning as an electron transport material for a red or green material. Furthermore, such material may, as a result of Its large HOMO-LUMO bandgap, be used as a blue electroluminescent material.

SUMMARY OF THE INVENTION

According to the invention, improved electron Injection, and therefore improved PLED performance, may be accomplished by increasing the electron affinity of known polyfluorenes.

Accordingly, in a first aspect the invention provides a polymer comprising optionally substituted first repeat units of formula (I):

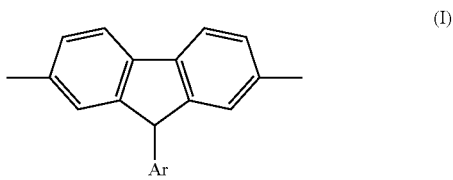

(I)

wherein Ar is selected from:
  (a) aromatic hydrocarbon substituted with at least one electron withdrawing group or
  (b) electron withdrawing heteroaryl.

Preferably, the polymer comprises repeat units of formula (II):

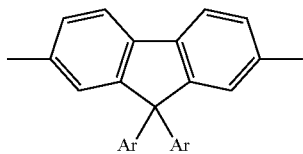

(II)

wherein each Ar is independently selected from:
(a) aromatic hydrocarbon substituted with at least one electron withdrawing group or
(b) electron withdrawing heteroaryl.

Preferred Ar groups according to (a) are independently selected from units of formula (III):

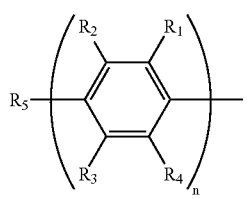

(III)

wherein n is from 1-3 and $R_1$-$R_5$ are independently selected from:
hydrogen;
solubilizing groups selected from alkyl, alkoxy, arylalkyl and heteroarylalkyl; and
electron withdrawing groups
such that at least one of $R_1$-$R_5$ is an electron withdrawing group. Most preferably n=1, i.e. Ar is phenyl.

Another preferred set of Ar groups according to (a) are fused aromatic hydrocarbons such as naphthalene and anthracene.

Preferably, the electron withdrawing group is selected from: groups comprising fluorine, cyano, nitro, carboxyl, amides, ketones, phosphinoyl, phosphonates, sulfones and esters. More preferably, the at least one electron withdrawing group is selected from fluorine atoms, fluoroalkyl, fluoroaryl and fluoroheteroaryl.

Preferred electron withdrawing heteroaryls according to (b) are optionally substituted N-containing heteroaryls, in particular optionally substituted pyridines, most particularly pyridine-4-yl; pyrazines; pyrimidines; pyridazines; triazines, most particularly 1,3,5-triazine-2-yl and oxadiazoles. The electron withdrawing heteroaryl may be substituted with electron withdrawing groups as outlined above to further increase its electron withdrawing effect.

Preferably, the polymer according to the invention comprises a second repeat unit. More preferably the second repeat unit is selected from triarylamines and heteroaromatics.

Preferably, the polymer according to the invention is capable of transporting electrons. In addition, the polymer preferably has at least one segment capable of hole transport and/or emission. Two or more functions of hole transport, electron transport and emission may be provided by the same segment. In particular, a single segment may function as both an electron transporter and an emitter.

In a second aspect, the invention provides an optical device, preferably an electroluminescent device, comprising a polymer as described above.

In one embodiment of the second aspect is provided an electroluminescent device comprising:
a first electrode for injecting charge carriers of a first type;
a second electrode for injecting charge carriers of a second type; and
an emissive layer comprising a polymer according to the first aspect of the invention between the first and second electrodes.

The emissive material within the emissive layer may be the polymer according to the first aspect of the invention or another material, preferably another polymer, blended with the polymer according to the first aspect of the invention. Preferably, the polymer according to the first aspect of the invention is capable of transporting electrons In this device.

In a third aspect, the Invention provides a monomer comprising an optionally substituted compound of formula (IV):

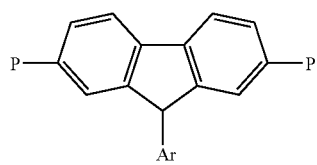

(IV)

wherein each P independently represents a polymerizable group and Ar is as defined above.

Preferably, the monomer comprises an optionally substituted compound of formula (V):

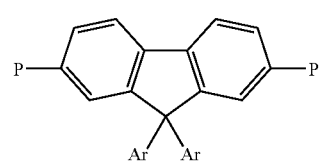

(V)

Preferably, each P is independently selected from a reactive boron derivative group selected from a boronic acid group, a boronic ester group and a borane group and a reactive halide group.

In a fourth aspect, the invention provides a process for preparing a polymer comprising a step of reacting a first monomer as described above with a second monomer that may be the same or different from the first monomer under conditions so as to polymerize the monomers.

Preferably, the process comprises polymerizing in a reaction mixture:
(a) a monomer according to the third aspect of the invention wherein each P is a boron derivative functional group selected from a boronic acid group, a boronic ester group and a borane group, and an aromatic monomer having at least two reactive halide functional groups; or
(b) a monomer according to the third aspect of the invention wherein each P is a reactive halide functional group, and an aromatic monomer having at least two boron derivative functional groups selected from boronic acid groups, boronic ester groups and borane groups; or (c) a monomer according to the third aspect of the invention wherein one P is a reactive halide functional group and one P is a boron derivative functional group selected from a boronic acid group, a boronic ester group and a borane group, wherein the reaction mixture comprises a catalytic amount of a catalyst suitable for catalyzing the polymerization of the aromatic monomers, and a base in an amount sufficient to convert the boron derivative functional groups into boronate anionic groups.

The inventors have found that polymers according to the invention function effectively as electron transporting materials for red, green or blue electroluminescent polymers without adversely affecting device properties as has been found for systems having aliphatic electron withdrawing 9-substituents such as perfluoroalkyl.

DETAILED DESCRIPTION OF THE INVENTION

The polymers prepared using monomers according to the invention may be homopolymers or copolymers. A wide range of co-monomers for polymerization with the monomers of the invention will be apparent to the skilled person. Examples of comonomers include triarylamines as disclosed in, for example, WO 99/54385 and heteroaryl units as disclosed in, for example, WO 00/46321 and WO 00/55927.

Particularly preferred triarylamine repeat units for such copolymers include units of formulae 1-6:

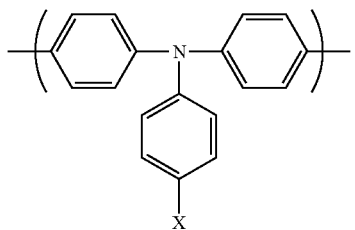

1

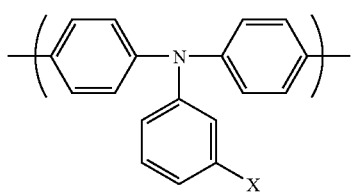

2

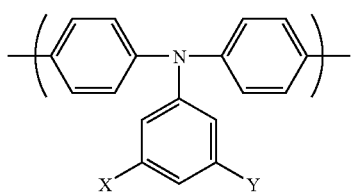

3

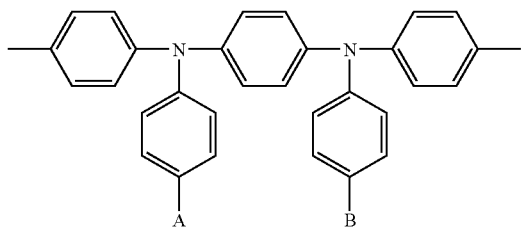

4

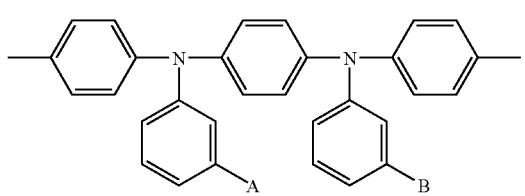

5

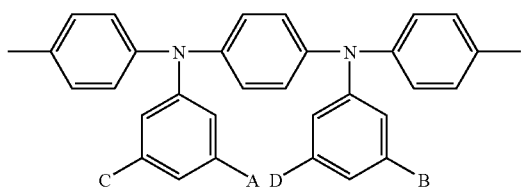

6

X and Y may be the same or different and are substituent groups. A, B, C and D may be the same or different and are substituent groups. It is preferred that one or more of X, Y, A, B, C and D is independently selected from the group consisting of alkyl, aryl, perfluoroalkyl, thioalkyl, cyano, alkoxy, heteroaryl, alkylaryl and arylalkyl groups. One or more of X, Y, A, B, C and D also may be hydrogen. It Is preferred that one or more of X, Y, A, B, C and D is independently an unsubstituted, isobutyl group, an n-alkyl, an n-alkoxy or a trifluoromethyl group because they are suitable for helping to select the HOMO level and/or improving solubility of the polymer.

Particularly preferred heteroaryl repeat units for such copolymers include units of formulae 7-21:

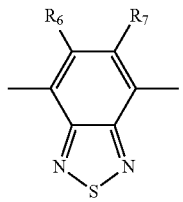

7 wherein $R_6$ and $R_7$ are the same or different and are each independently a substituent group. Preferably, one or both of $R_6$ and $R_7$ may be selected from hydrogen, alkyl, aryl, perfluoroalkyl, thioalkyl, cyano, alkoxy, heteroaryl, alkylaryl, or arylalkyl. These groups are preferred for the same reasons as discussed in relation to X, Y, A, B, C and D above. Preferably, for ease of manufacture, $R_6$ and $R_7$ are the same. More preferably, the are the same and are each a phenyl group.

8 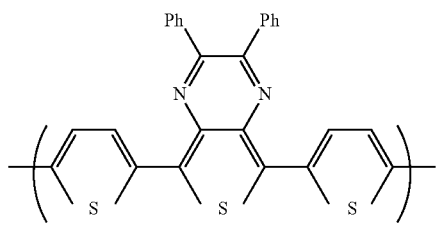
9 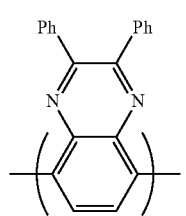
10 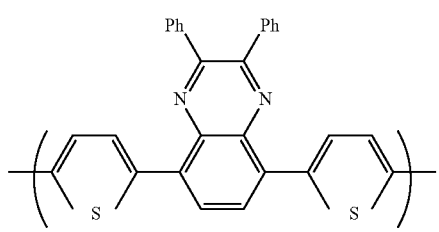
11 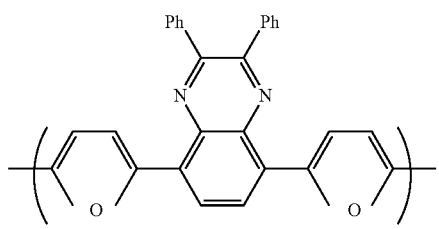
12 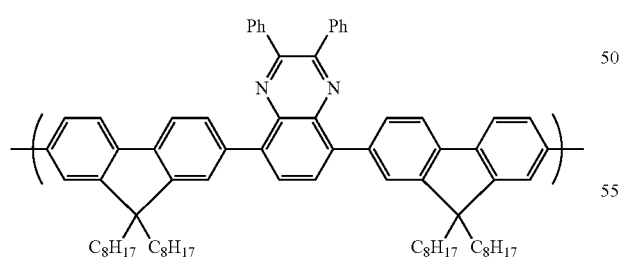
13 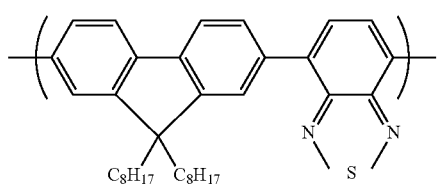
-continued
14 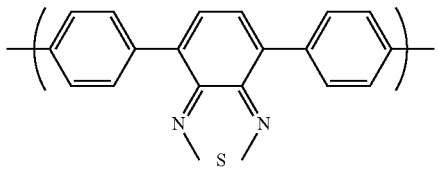
15 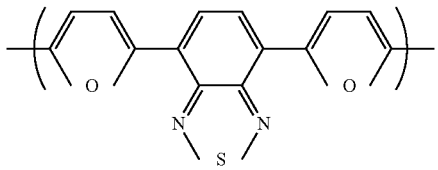
16 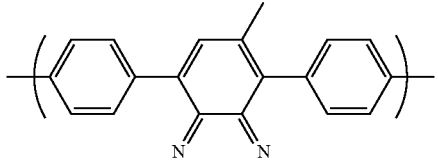
17 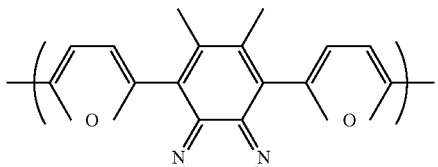
18 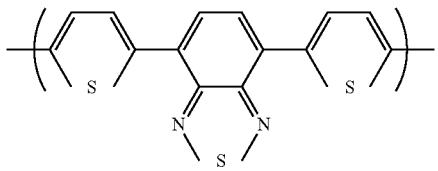
19 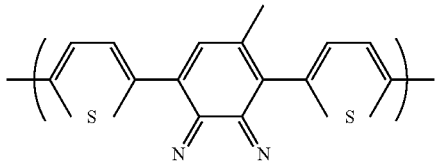
20 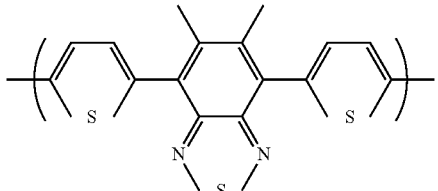

11

-continued

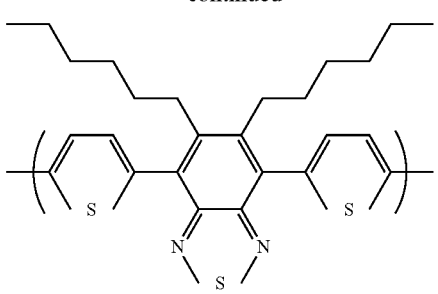
21

Electron withdrawing groups/heteroaryls suitable for monomers and repeat units of formula (I) according to the invention will be apparent to the skilled person. In particular, those substituents/heteroaryls having a positive Hammett sigma constant may be suitable. The electron withdrawing groups/heteroaryls should preferably be selected to avoid interference with the polymerization of the monomer, e.g. by steric hindrance.

Electron withdrawing groups Ar according to (a) or (b) may be provided with solubilizing groups. Particularly preferred as solubilizing groups are optionally substituted, branched or linear $C_{1-20}$ alkyl or alkoxy, more preferably $C_{4-10}$ alkyl.

12

The polymer according to the invention may be a homopolymer or a copolymer. Where It is a copolymer, it may be a 1:1 copolymer, random or block copolymer. A block copolymer according to the invention may comprise at least two regions selected from:

a hole transporting region an electron transporting region an emissive region.

The functions of charge transport and emission may be provided by a range of moieties which will be apparent to the skilled person, as described in, for example, WO 00/55927 or U.S. Pat. No. 6,353,083.

Preferred methods for polymerization of the monomers according to the invention are Suzuki polymerization as described in, for example, WO 00/53656 and Yamamoto polymerization as described in, for example, T. Yamamoto, "Electrically Conducting And Thermally Stable π-Conjugated Poly(arylene)s Prepared by Organometallic Processes", Progress in Polymer Science 1993, 17, 1153-1205.

EXAMPLES

Monomer Examples

Monomers according to the invention may be prepared in accordance with the following scheme:

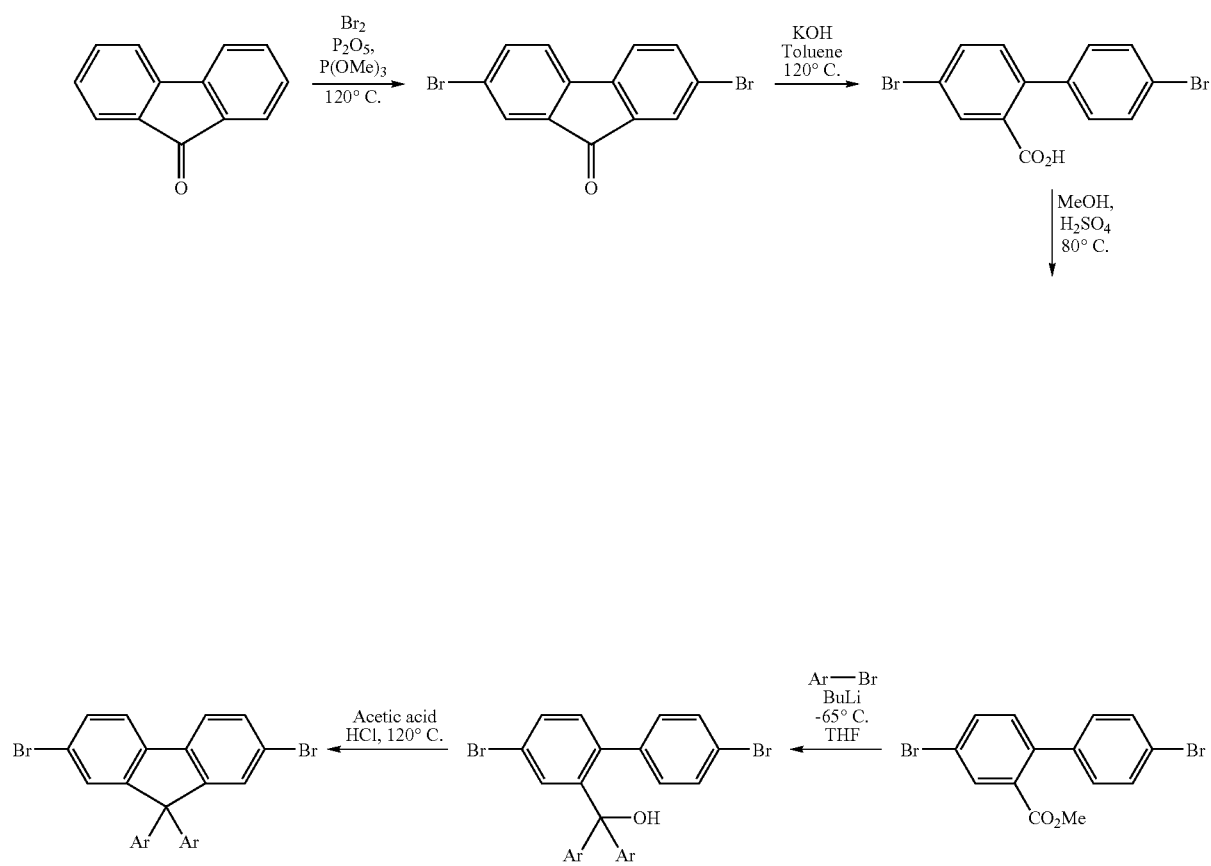

Modelled Examples

The effect of appending various groups to the phenyl rings of 9,9-diphenylfluorene repeat unit HOMO and LUMO levels was calculated using AM1 from the AMPAC software package (1) and ZINDO calculations from the Gaussian software package (2).

1) AM1 in Ampac program package

*Ampac* 5.0 *User's Manual,* © 1994 Semichem, 7128 Summit, Shawnee, Kans. 66216

2) ZINDO from Gaussian software:

Gaussian 98, Revision A.9,

M. J. Frisch, G. W. Trucks, H. B. Schlegel, G. E. Scuseria,

M. A. Robb, J. R. Cheeseman, V. G. Zakrzewski, J. A. Montgomery, Jr.,

R. E. Stratmann, J. C. Burant, S. Dapprich, J. M. Millam,

A D. Daniels, K. N. Kudin, M. C. Strain, O. Farkas, J. Tomasi,

V. Barone, M. Cossi, R. Cammi, B. Mennucci, C. Pomelli, C. Adamo,

S. Clifford, J. Ochterski, G. A. Petersson, P. Y. Ayala, Q. Cui,

K. Morokuma, D. K. Malick, A. D. Rabuck, K. Raghavachari,

J. B. Foresman, J. Cioslowski, J. V. Ortiz, A. G. Baboul,

B. B. Stefanov, G. Liu, A. Liashenko, P. Piskorz, I. Komaromi,

R. Gomperts, R. L. Martin, D. J. Fox, T. Keith, M. A. Al-Laham,

C. Y. Peng, A. Nanayakkara, M. Challacombe, P. M. W. Gill,

B. Johnson, W. Chen, M. W. Wong, J. L. Andres, C. Gonzalez,

M. Head-Gordon, E. S. Replogle, and J. A. Pople,

Gaussian, Inc., Pittsburgh Pa., 1998.

The results are summarised in the table below:

| Structure | Name | HOMO (eV) | LUMO (eV) |
|---|---|---|---|
| | F8 | −7.84 | 0.04 |
| | dpf | −7.79 | −0.06 |
| | pdpf | −8.16 | −0.40 |
| | mdpf | −8.08 | −0.30 |
| | dmdpf | −8.36 | −0.72 |
| | fldpf | −8.25 | −1.10 |
| | Cldpf | −7.70 | −0.01 |
| | C8dpf | −7.68 | 0.00 |

-continued

| Structure | Name | HOMO (eV) | LUMO (eV) |
|---|---|---|---|
| ![structure] | hadpf | −7.69 | 0.04 |

As can be seen from these examples, replacement of octyl with phenyl has a relatively small effect on LUMO level, however a significant change Is only effected by substitution by electron withdrawing groups such as fluorine or perfluoroalkyl. By comparison with unsubstituted diphenylfluorene, it can be seen that alkoxy groups substituted in the para position, as per the prior art, are not predicted to show any electron withdrawing character. This is consistent with known electron withdrawing properties of such substituents, in particular their negative Hammett sigma constants.

Polymer Examples

Polymers according to the invention having formula P1 were prepared by Suzuki polymerization in accordance with the process described in WO 00/53656, by reaction of the following monomers in the ratios set out in the table below:
2,7-dioxalaborane-9,9-di-(n-octyl)fluorene
2,7-dioxalaborane-9,9-di-(4-trifluoromethylphenyl)fluorene
N,N-di(4-bromophenyl)-N-(4-sec-butylphenyl)amine (to produce the "TFB" repeat unit shown below)
Di [N-(4-bromophenyl)-N-(4-n-butylphenyl)]-phenylene-1,4-dlamine (to produce the "PFB" repeat unit shown below)

| Example | w | x | y | z |
|---|---|---|---|---|
| 1 | 50 | 10 | 10 | 30 |
| 2 | 50 | 0 | 10 | 40 |
| 3 | 0 | 0 | 50 | 50 |

-continued

| Example | w | x | y | z |
|---|---|---|---|---|
| 4 | 0 | 0 | 0 | 100 |
| 5 | 50 | 0 | 0 | 50 |

Where TFB and PFB are present, as in example 1, the polymer may function as a blue electroluminescent polymer as described in WO 00/55927.

Where TFB is present and PFB is absent the polymer may be a block copolymer with hole and electron transporting segments (example 2) or a 1:1 regioregular hole transporting copolymer (example 3). It may also show blue electroluminescence.

Where TFB and PFB are absent, the polymer may be used as an electron transporting polymer for a red, green or blue electroluminescent material (examples 4 and 5).

Device Example

A device according to the invention was prepared as follows:
1) Depositing poly(ethylenedioxythiophene)/polystyrene sulfonate (PEDT/PSS), available from Bayer® as Baytron P®, by spin coating onto an indium tin oxide anode supported on a glass substrate (available from Applied Films, Colorado, USA).
2) Depositing polymer P1 onto the PEDT/PSS by spin coating from xylene solution having a concentration of 2% w/v.
3) Depositing a cathode comprising a first layer of calcium and a second layer of aluminium by evaporation onto the polymer P1.

Although the present invention has been described in terms of specific exemplary embodiments, it will be appreciated that various modifications, alterations and/or combinations of features disclosed herein will be apparent to those skilled In the art without departing from the spirit and scope of the invention as set forth in the following claims.

The invention claimed is:

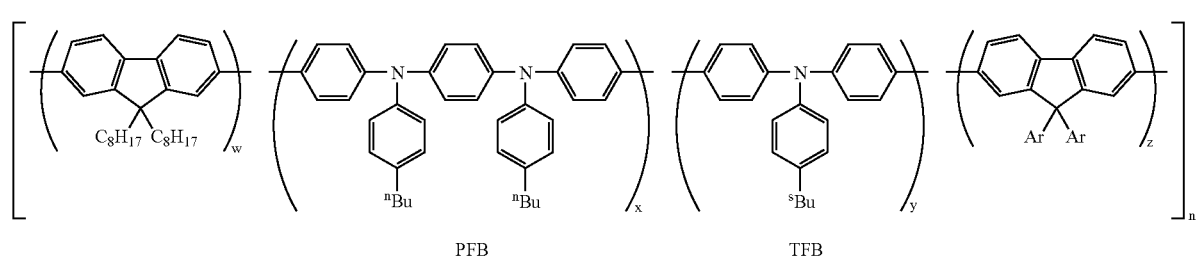

P1 wherein w+x+y+z=1, w+z≧0.5, 0≦x+y≦0.5, z>0 and n≧2

Particular embodiments are as follows:

1. A polymer comprising optionally substituted first repeat units of formula (I):

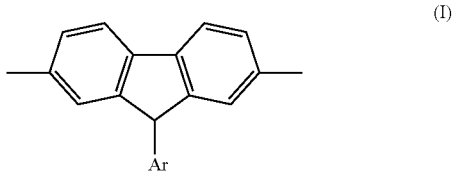

(I)

wherein Ar is phenyl or oligophenyl substituted with at least one electron withdrawing group, said electron withdrawing group comprising at least one of a fluorine and a nitro group.

2. A polymer according to claim 1 comprising repeat units of formula (II):

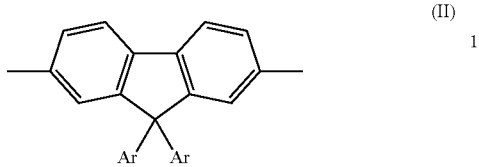

(II)

wherein each Ar is phenyl or oligophenyl substituted with at least one electron withdrawing group, said electron withdrawing group comprising at least one of a fluorine and a nitro group.

3. A polymer according to claim 1 wherein each Ar is independently selected from units of formula (III):

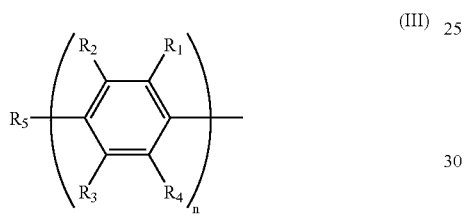

(III)

wherein n is from 1-3 and $R_1$-$R_5$ are independently selected from the group consisting of:
hydrogen;
solubilizing groups selected from the group consisting of alkyl, alkoxy, arylalkyl and heteroarylalkyl; and
electron withdrawing groups comprising at least one of a fluorine and a nitro group,
such that at least one of $R_1$-$R_5$ is an electron withdrawing group.

4. A polymer according to claim 1 wherein the at least one electron withdrawing group is selected from the group consisting of fluorine atoms, fluoroalkyl, fluoroaryl and fluoroheteroaryl.

5. A polymer according to claim 1 comprising a second repeat unit.

6. A polymer according to claim 5 wherein the second repeat unit is selected from the group consisting of triarylamines and heteroaromatics.

7. A polymer according to claim 1 that is capable of transporting electrons.

8. A polymer according to claim 7 that comprises at least one segment capable of at least one of hole transport and hole emission.

9. An optical device comprising a polymer according to claim 1.

10. An optical device according to claim 9 that is an electroluminescent device.

11. An electroluminescent device comprising:
a first electrode for injecting charge carriers of a first type;
a second electrode for injecting charge carriers of a second type; and
an emissive layer comprising a polymer according to claim 1 between the first and second electrodes.

12. A monomer comprising an optionally substituted compound of formula (IV):

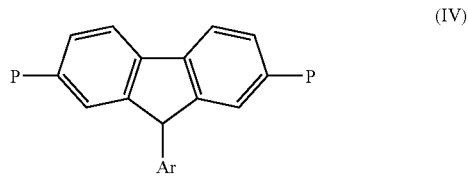

(IV)

wherein each P independently represents a polymerizable group and Ar is phenyl or oligophenyl substituted with at least one electron withdrawing group, said electron withdrawing group comprising at least one of a fluorine and a nitro group.

13. A monomer according to claim 12 comprising an optionally substituted compound of formula (V):

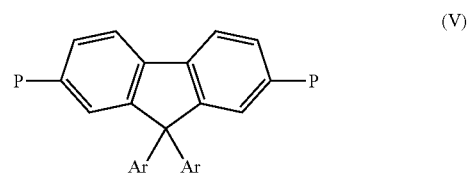

(V)

wherein each P independently represents a polymerizable group and each Ar is phenyl or oligophenyl substituted with at least one electron withdrawing group, said electron withdrawing group comprising at least one of a fluorine and a nitro group.

14. A monomer according to claim 12 wherein each P is independently selected from a reactive boron derivative group and a reactive halide group.

15. A process for preparing a polymer comprising a step of reacting a first monomer as defined in claim 12 with a second monomer that may be the same or different from the first monomer under conditions so as to polymerize the monomers.

16. A process for preparing a polymer according to claim 15 which comprises polymerizing in a reaction mixture:
(a) a monomer according to claim 16 wherein each P is a reactive boron derivative group selected from the group consisting of boronic acid groups, boronic ester groups and borane groups, and an aromatic monomer having at least two reactive halide functional groups; or
(b) a monomer according to claim 16 wherein each P is a reactive halide functional group, and an aromatic monomer having at least two boron derivative functional groups selected from boronic acid groups, boronic ester groups and borane groups; or
(c) a monomer according to claim 16 wherein one P is a reactive halide functional group and one P is a reactive boron derivative group selected from the group consisting of boronic acid groups, boronic ester groups and borane groups, wherein the reaction mixture comprises a catalytic amount of a catalyst suitable for catalyzing the polymerization of the aromatic monomers, and a base in an amount sufficient to convert the boron derivative functional groups into boronate anionic groups.

17. A monomer according to claim 14, wherein the reactive boron derivative group is selected from the group consisting of boronic acid groups, boronic ester groups and borane groups.

* * * * *

UNITED STATES PATENT AND TRADEMARK OFFICE
CERTIFICATE OF CORRECTION

PATENT NO. : 7,494,720 B2
APPLICATION NO. : 10/533989
DATED : February 24, 2009
INVENTOR(S) : Jeremy Burroughes et al.

It is certified that error appears in the above-identified patent and that said Letters Patent is hereby corrected as shown below:

At Column 1, line 17, "In" should be -- in --
At Column 1, line 18, "In" should be -- in --
At Column 1, line 22, "Into" should be -- into --
At Column 1, line 65, "In" should be -- in --
At Column 2, line 42, "Is" should be -- is --
At Column 2, line 65, "$w \geq 0.5$" should be -- $w < 0.5$ --
At Column 2, line 65, "$n \geq 2$" should be -- $n < 2$ --
At Column 4, line 24, "In" should be -- in --
At Column 4, line 38, "Its" should be -- its --
At Column 4, line 45, "Injection" should be -- injection --
At Column 6, line 19, "In" should be -- in --
At Column 6, line 20, "Invention" should be -- invention --
At Column 8, line 40, "Is" should be -- is --
At Column 12, line 2, "It" should be -- it --
At Column 15, line 20, "Is" should be -- is --
At Column 15, line 56, "$w+z \geq 0.5$" should be -- $w+z < 0.5$ --
At Column 15, line 56, "$n \geq 2$" should be -- $n < 2$ --
At Column 16, line 37, "In" should be -- in --

Signed and Sealed this

Ninth Day of February, 2010

David J. Kappos
*Director of the United States Patent and Trademark Office*